United States Patent [19]
Nyenhuis et al.

[11] Patent Number: 5,355,393
[45] Date of Patent: Oct. 11, 1994

[54] DIGITAL OSCILLATOR FOR CARRIER FREQUENCY SYNCHRONIZATION

[75] Inventors: Detlev Nyenhuis, Sibbesse; Lothar Vogt, Hohenhameln, both of Fed. Rep. of Germany

[73] Assignee: Blaupunkt-Werke GmbH, Hildesheim, Fed. Rep. of Germany

[21] Appl. No.: 983,680

[22] Filed: Dec. 1, 1992

[30] Foreign Application Priority Data

Dec. 5, 1991 [DE] Fed. Rep. of Germany ....... 4140132

[51] Int. Cl.$^5$ .......................................... H04L 27/06
[52] U.S. Cl. ..................................... 375/97; 455/75; 455/182.2
[58] Field of Search .................. 375/118, 120, 97, 81; 329/307, 306, 325, 323; 455/208, 260, 75, 182.2; 331/15, 25, 18, 135, 57

[56] References Cited

U.S. PATENT DOCUMENTS

| | | | |
|---|---|---|---|
| 3,789,316 | 1/1974 | Goetz et al. | 329/325 |
| 4,030,045 | 6/1977 | Clark | 375/120 |
| 4,057,762 | 11/1977 | Namiki | 375/120 |
| 4,100,499 | 7/1978 | Monrolin | 375/81 |
| 4,285,044 | 8/1981 | Thomas | 364/721 |
| 4,344,178 | 8/1982 | Waters | 375/81 |
| 4,384,357 | 5/1983 | deBuda | 375/81 |
| 4,495,475 | 1/1985 | Mark | 331/12 |
| 4,570,125 | 2/1986 | Gibson | 375/81 |
| 4,795,986 | 1/1989 | Ceroni et al. | 329/304 |
| 4,862,513 | 8/1989 | Brägas | 455/45 |
| 4,876,542 | 10/1989 | van Bavel et al. | 341/143 |
| 5,272,730 | 12/1993 | Clark | 375/81 |

FOREIGN PATENT DOCUMENTS

| | | |
|---|---|---|
| 0291826 | 11/1988 | European Pat. Off. |
| 0350663 | 1/1990 | European Pat. Off. |
| 3119448 | 12/1982 | Fed. Rep. of Germany |
| 4006654 | 9/1991 | Fed. Rep. of Germany |

OTHER PUBLICATIONS

Derwent World Patents Index English abstract of DE-OS 40 06 654.
Dean Tomasula, "Motorola Develops DSP FM Decoding Circuits", *Automotive Electronics Journal*, Feb. 26, 1990, p. 38.
Motorola, Inc., "24-Bit General Purpose General Signal Processor", Document DSP56000/D, rev. 2, Tempe, Ariz., 1992, 18 pages.
Motorola, Inc., "DSP Update 3Q92", document SG146/D, rev. 7, Tempe, Ariz., 3rd quarter, 1992, four pages.
Lufthansa German Airlines, "ARI: Motorists' Early Warning", Jun. 1984, inflight magazine, p. 5.

*Primary Examiner*—Stephen Chin
*Assistant Examiner*—T. Ghebretinsae
*Attorney, Agent, or Firm*—Frishauf, Holtz, Goodman & Woodward

[57] ABSTRACT

A new digital oscillator is described that can be synchronized with a broadcast digital input signal by iteratively rotating the phase of the complex oscillator signal by increasing or decreasing the components, depending upon the phase difference between the broadcast signal and the oscillator output signal.

2 Claims, 1 Drawing Sheet

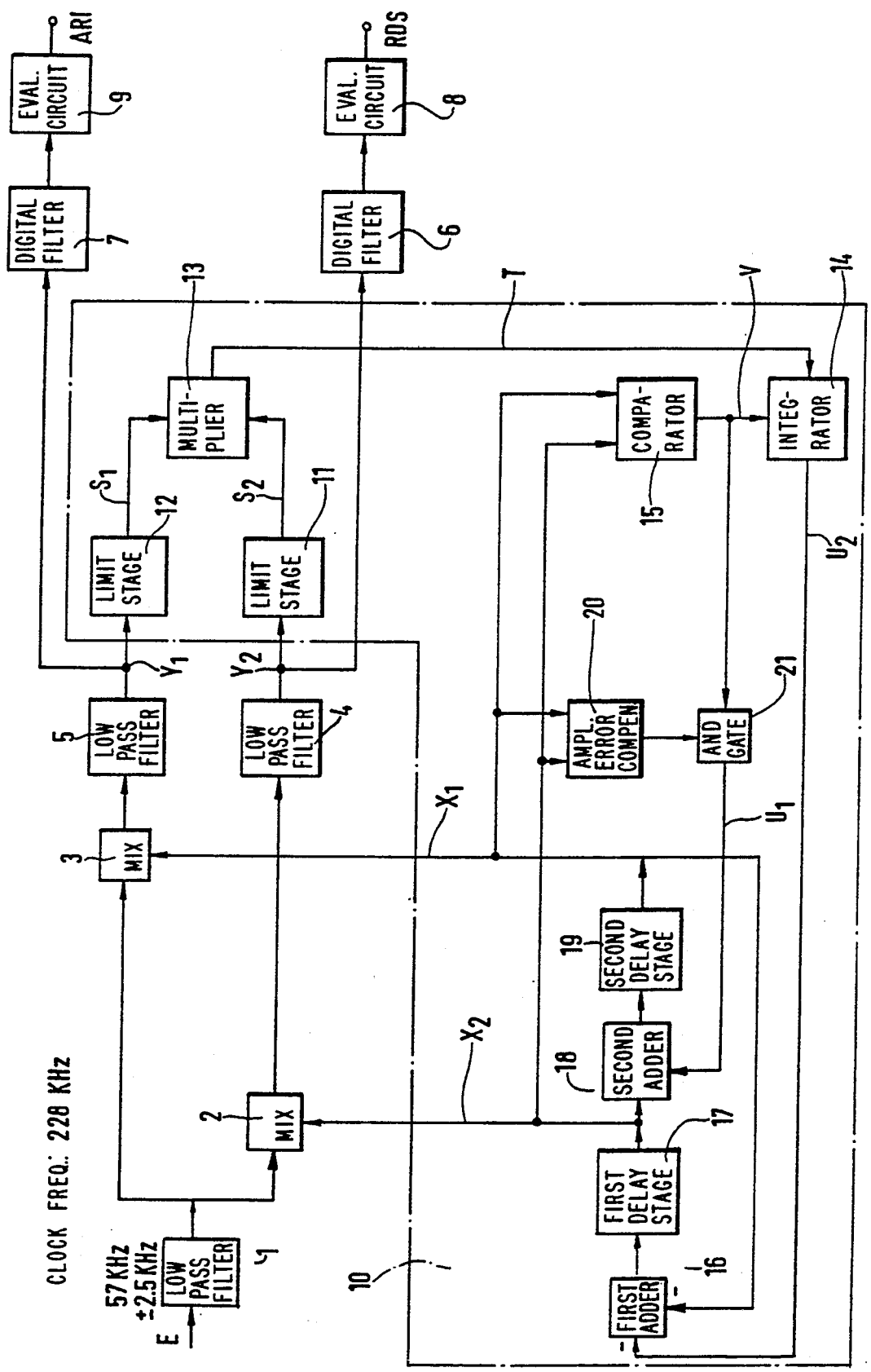

DIGITAL OSCILLATOR FOR CARRIER FREQUENCY SYNCHRONIZATION

CROSS-REFERENCE TO RELATED PATENTS, THE DISCLOSURES OF WHICH ARE INCORPORATED BY REFERENCE

U.S. Pat. No. 4,862,513, BRÄGAS, issued AUG. 29, 1989, entitled RADIO RECEIVER WITH TWO DIFFERENT TRAFFIC INFORMATION DECODERS; U.S. Pat. No. 4,876,542, VAN BAVEL & WILLIAMS/MOTOROLA, October 1989.

FIELD OF THE INVENTION

The present invention relates generally to car radios, and more particularly to an improved digital local oscillator for use in decoders for radio broadcasts having a data subcarrier, such as the ARI$^{tm}$ or RDS (Radio Data System) information services for motorists, which use a 57 KHz data subcarrier.

BACKGROUND

Digital oscillators are necessary when a carrier-frequency signal that is present in digital form needs to be demodulated. To do this, the oscillator must be synchronized with the carrier frequency of the transmitted signal.

THE INVENTION

Accordingly, it is an object of the present invention to provide a digital oscillator with an error correction circuit that can be synchronized in phase with a digital input signal, and which distinguishes itself by low manufacturing cost.

Briefly, the 57 KHz digital subcarrier signal from the received broadcast is sampled, preferably at a rate of 228 KHz, the phase difference between the subcarrier signal and the oscillator output signal is measured, the phase difference signal is treated as an error signal, and the error is reduced by stepwise rotation of the phase of the complex oscillator signal by increasing or decreasing the signal's components depending upon the phase difference between the broadcast signal and the oscillator output signal.

The error correcting circuit can be built with particular simplicity if the digital subcarrier is sampled four times during each cycle (subcarrier wavelength), that is, at a rate four times the subcarrier frequency.

DRAWING

FIG. 1 is a block diagram of the phase adjustment circuit of the present invention, shown within the dash-dotted box, as part of an otherwise conventional ARI/RDS radio receiver.

DETAILED DESCRIPTION

The purpose of this circuit is to recognize the modulation of a 57 KHz subcarrier. The 57 KHz subcarrier is used by broadcasting stations, particularly in Europe, to transmit two independent information systems, ARI traffic announcement recognition and the RDS radio data signal. ARI is a registered trademark (U.S. Pat. No. 1,282,281) of Blaupunkt Werke GmbH. This modulated carrier signal, included in the multiplex (MPX) signal of the received broadcasting transmitter, is present at the input of the circuit, and is sampled at a rate of 228 KHz.

As shown in FIG. 1, the sample values are directed to a low-pass filter 1, the output of which is split into two partial signals, each of which is fed to a first input of a respective assigned mixing stage 2 or 3. The output of each mixing stage is fed to a respective low-pass filter 4 or 5.

Connected to the output of the low pass filter 4, and after a suitable digital filter 6, is an evaluation circuit 8 for the radio data signal (RDS); connected to the output of the low-pass filter 5, and after a suitable digital filter 7, is an evaluation circuit 9 for ARI traffic-announcement identification. This portion of the circuit for the outputs of the low-pass filters 4 and 5 is conventional, and does not represent subject-matter which is part of the present invention. Therefore, it is shown only schematically.

The upper half of the figure represents a phase detector, lower-left elements 16-19 represent a digital oscillator, and lower-right elements 14, 15, 20, and 21 represent a control stage.

Rather, the invention is represented by a circuit 10, which is also connected to the outputs of the two low-pass filters 4 and 5. This circuit 10 supplies a first output signal $X_1$ which is fed to mixing stage 3 as the second input signal thereof, and a second output signal $X_2$ which is fed to mixing stage 2 as the second input signal thereof.

To generate signals $X_1$ and $X2$, the output signal $Y_1$ of low-pass filter 5 and the output signal $Y_2$ of low-pass filter 4 are each fed through respective limiter stages 12 and 11, at whose outputs consequently only values of $+1$ and $-1$ can be picked up. The respective output signals $S_1$ and $S_2$ of limiter stages 12 and 11 are multiplied by one another in a multiplier 13, resulting in an output signal T with the value $+1$ or $-1$. Thus, during the individual clock periods of the 228 KHz sampling frequency, the value of signal T is either $+1$ or $-1$.

Output signal T is fed to a short term integrator 14, which sums the values of output signal T over a predetermined number of clock periods, and compares the resulting total with a positive reference value $+A$ and a negative reference value $-A$. Upstream of integrator 14, a comparator 15 compares the values of $X_1$ and $X_2$. Comparator 15 generates an output signal V which indicates whether the amplitude of signal $X_2$ is at least equal to the amplitude of signal $X_1$, and feeds this signal V to a second input of integrator 14 and to an AND-gate 21.

If $X_2 \geq X_1$ and integrator 14 determines that its sum of the output signals T overshoots the positive reference value $+A$ or undershoots the negative reference value $-A$, integrator 14 feeds a phase increment signal $U_2$ or $-U_2$ to a first adder stage 16. The purpose of the phase increment signal is phase regulation of the oscillator output signals $X_1$ and $X_2$.

The output of adder stage 16 is delayed by one clock period in a delay stage 17, the output of which forms the input signal $X_2$ to mixer stage 2.

At the same time, signal $X_2$ is also fed to comparator 15, already identified.

For amplitude control, the signal $X_2$ is fed to a second adder stage 18. In this adder stage 18, a predetermined small value $U_1$ is added to or deducted from the input signal $X_2$, if, on one hand, an amplitude error compensation circuit 20 determines that the sum of the squares of the amplitudes of input signals $X_1$ and $X_2$ is smaller than a preset reference value $(1-a)$ or larger than the reference value $(1+a)$, where a represents a selectable amount between 0 and 1 representing a maximum permissable phase difference, and, on the other hand, the AND gate 21 has been "released" by signal V from comparator 15. The output signal of circuit 20 forms the second input signal of AND-gate 21, and the output signal of AND-gate 21 forms the second input signal of second adder 18.

Analogously to adder 16 mentioned above, the output value of adder stage 18 is delayed by one clock period, that is, by 90° in phase (¼ wavelength). The output signal of this delay stage 19 forms the second input signal $X_1$ for mixer stage 3.

This signal $X_1$ is likewise fed to the comparator stage 15 as well as to circuit 20 (as is input signal $X_2$) for calculation of the sum of the square values of $X_1$ and $X_2$.

Furthermore, in a feedback loop, signal $X_1$ is fed back to the second input of the first adder stage 16.

Accordingly, from time to time, the input signal is incrementally increased or reduced until the phase error between the oscillator output signal and input signal disappears.

Through this control circuit, the value of the oscillator output signals $X_1$ and $X_2$ increases or decreases. This amplitude error is compensated for in circuit 20.

Both controls (phase control and amplitude control) are active only when the comparator stage 15 has recognized the selected control condition ($X_2 \geq |X_1|$).

The complete circuit of the invention can also be described by the following equations:

ARI: $\alpha = 1 + \text{mod} \sin(2\pi I)$ mod = degree of modulation

I = region- and interrupting-bulletin- identifier

RDS: r

Sampling cycle no.: K $E(K): \alpha \cdot \sin(\pi/2 \cdot K) + r \cdot \cos(\pi/2 \cdot K)$
$X_1: \sin(\pi/2 \cdot K + \Theta) \quad \Theta = \text{phase error}$
$X_2: \cos \pi/2 (K + \Theta)$
$Y_1: \sim \frac{1}{2}(\alpha \cos \Theta + r \sin \Theta)$
$Y_2: \sim \frac{1}{2}(-\alpha \sin \Theta + r \cos \Theta)$ $S_1(K): \quad -1 \text{ if } Y_1 < 0$
$\quad\quad\quad : \quad +1 \text{ if } Y_1 \geq 0$ $S_2(K): \quad 1 \text{ if } Y_2 \geq 0$
$\quad\quad\quad : \quad -1 \text{ if } Y_2 < 0$ $T(K): \quad +1 \atop : \quad -1 \Big\} = S_1(K) \cdot S_2(K)$ $V: \quad +1 \text{ if } X_2 \geq X_1$
$\quad : \quad 0 \text{ otherwise}$ $U_1(K): = > 0 \quad = \quad \text{const if } X^2 + X_2{}^2 \leq 1 - a$
$\quad\quad\quad\quad\quad = \quad -\text{const if } X^2 + X_2{}^2 > 1 + a$ $U_2(mK): = > 0 \quad = \quad \text{const if } \Sigma \text{ of } T(K) \text{ during}$
$\quad\quad\quad\quad\quad\quad\quad\quad m \text{ clock impulses} \geq A$
$\quad\quad\quad\quad\quad = \quad -\text{const if } \Sigma \text{ of } T(K) \text{ during}$
$\quad\quad\quad\quad\quad\quad\quad\quad m \text{ clock impulses} \leq -A$
$\quad\quad\quad\quad\quad = \quad 0 \text{ otherwise}$ The following components of said circuit have inputs connected to said clock signal (preferably 228 KHz):

Multiplier 13

Integrator 14

Circuit 10, mixers 2–3, and filters 4–5 are preferably implemented using a Motorola digital signal processor model 56000 and suitable control program as described above.

What is claimed is:

1. A circuit for synchronizing signal phases of
   a radio receiver digital local oscillator output signal and a received digital input signal (E), comprising
   a digital local oscillator (16, 17, 18, 19);
   first mixing means (3) for mixing said received signal (E) with a second output signal ($X_2$) of said local oscillator;
   means (11-13), connected to outputs of said first and second mixing means (2,3), for measuring any phase difference between said received signal and said local oscillator output signals;
   wherein said digital local oscillator includes:
   a first adder stage (16) for generating an oscillator output amplitude adjustment signal;
   a first delay stage (17), connected to an output of said first adder stage (16), for partial-cycle delay or retardation of said adjustment signal to generate said second local oscillator output signal ($X_2$);
   a second adder stage (18) having a first input connected to an output of said first delay stage (17) and an output;
   a second delay stage (19) having an input connected to the output of said second adder stage (18) and an output whose signal is said first local oscillator output signal ($X_1$), said first output signal ($X_1$) passing along a feedback line to an input of said first adder stage (16); and said circuit further comprises
   a control circuit (14, 15, 20, 21) receiving, as input signals, said first and second local oscillator output signals (X1, X2) and a third signal (T) from an output of said phase difference measuring means (11-13), and generating first (U1) and second (U2) output signals, said first output signal (U1) feeding a further input of said second adder stage (18) and said second output signal (U2) feeding a further input of said first adder stage (16), whereby
   said control circuit iteratively increases or decreases said second output signal (U2), serving as a phase increment signal, fed to said first adder stage (16), depending on the sign (plus or minus) of said third signal (T) representing said phase difference and, depending on a time-integrated value of said phase difference signal (T), iteratively increases or decreases said first output signal (U1) fed to said second adder stage (18) in such a way that the result of a vectorial addition of said first and second local oscillator output signals (X1, X2) will not go above a predetermined first reference value (1a), were a is a selectable amount between 0 and 1 representing a maximum permissible phase difference, and will not go below a predetermined second reference value (1−a).

2. A circuit according to claim 1, wherein said first delay stage retards said adjustment signal by a quarter cycle.

* * * * *